(12) United States Patent
Chi et al.

(10) Patent No.: US 9,876,083 B2
(45) Date of Patent: Jan. 23, 2018

(54) SEMICONDUCTOR DEVICES, FINFET DEVICES AND METHODS OF FORMING THE SAME

(71) Applicant: Taiwan Semiconductor Manufacturing Co., Ltd., Hsinchu (TW)

(72) Inventors: Liang-Chen Chi, Hsinchu (TW); Chia-Ming Tsai, Hsinchu County (TW); Chin-Kun Wang, Hsinchu (TW); Wei-Cheng Wang, New Taipei (TW); Miin-Jang Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 36 days.

(21) Appl. No.: 15/009,831

(22) Filed: Jan. 29, 2016

(65) Prior Publication Data

US 2017/0222000 A1    Aug. 3, 2017

(51) Int. Cl.
*H01L 29/66*  (2006.01)
*H01L 29/40*  (2006.01)
*H01L 29/78*  (2006.01)

(52) U.S. Cl.
CPC ...... *H01L 29/408* (2013.01); *H01L 29/66545* (2013.01); *H01L 29/66795* (2013.01); *H01L 29/7851* (2013.01)

(58) Field of Classification Search
CPC .............. H01L 29/408; H01L 29/7851; H01L 29/66795; H01L 29/66545
See application file for complete search history.

(56) References Cited

U.S. PATENT DOCUMENTS

| | | | |
|---|---|---|---|
| 2004/0185627 A1* | 9/2004 | Brask | H01L 21/28185 438/287 |
| 2007/0264837 A1* | 11/2007 | Rachmady | H01L 21/02178 438/758 |
| 2011/0121378 A1* | 5/2011 | Ahn | C23C 16/40 257/315 |
| 2014/0048859 A1* | 2/2014 | Nakano | H01L 29/4975 257/296 |
| 2015/0102431 A1* | 4/2015 | Chi | H01L 21/28185 257/411 |
| 2015/0137271 A1* | 5/2015 | Cai | H01L 29/66545 257/411 |
| 2016/0093616 A1* | 3/2016 | Lai | H01L 21/28088 257/369 |
| 2017/0076995 A1* | 3/2017 | Chang | H01L 21/823842 |

* cited by examiner

*Primary Examiner* — Thanh Y Tran
(74) *Attorney, Agent, or Firm* — JCIPRNET

(57) ABSTRACT

Semiconductor devices, FinFET devices and methods of forming the same are disclosed. One of the semiconductor devices includes a substrate, a gate over the substrate and a gate dielectric layer between the gate and the substrate. The gate dielectric layer includes an oxide-inhibiting layer having a dielectric constant greater than about 8 and being in an amorphous state.

18 Claims, 8 Drawing Sheets

SEMICONDUCTOR DEVICES, FINFET DEVICES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
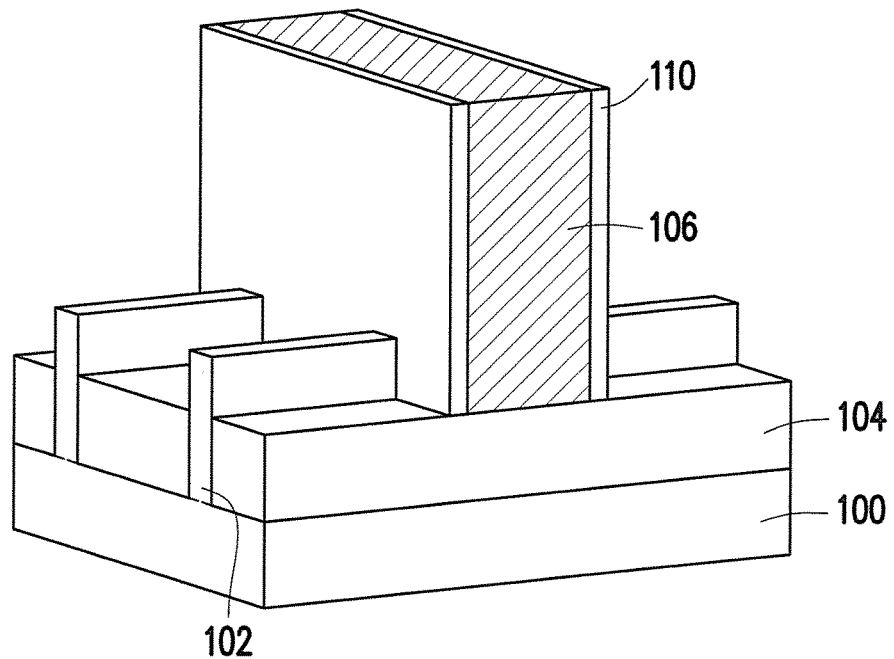
FIG. 1A to FIG. 1H are schematic perspective views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1H are schematic perspective views of a method of forming a FinFET device in accordance with some embodiments.

Referring to FIG. 1A, a substrate 100 with one or more fins 102 is provided. In some embodiments, the substrate 100 includes a group IV element or a group III-V semiconductor compound, such as Si, Ge, SiGe, GaAs, InAs, InGaAs, or the like. In some embodiments, the substrate 100 includes silicon substrate, a silicon-on-insulator (SOI) substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the one or more fins 102 extend in a first direction.

In some embodiments, the method of forming the substrate 100 with fins 102 includes forming a mask layer on a bulk substrate, and removing a portion of the bulk substrate by using the mask layer as an etch mask. In alternative embodiments, the method of forming the substrate 100 with fins 102 includes performing a sidewall image transfer (SIT) technique. In some embodiments, the fins 102 are oxidized to form stop layers respectively on surfaces of the fins 102, and the stop layers serve as etch stop layers for the subsequent dummy gate removal step.

Still referring to FIG. 1A, the substrate 100 further has an isolation layer 104 formed thereon. In some embodiments, the isolation layer 104 covers lower portions of the fins 102 and exposes upper portions of the fins 102. In some embodiments, the isolation layer 104 is a shallow trench isolation (STI) structure. The isolation layer 104 includes a dielectric material such as silicon oxide. The method of forming the isolation layer 104 includes forming an isolation material layer covering the fins 102, and removing a portion of the isolation material layer with chemical mechanical polishing (CMP) and/or etching back.

In some embodiments, the fins 102 are active fins and are formed before the formation of the isolation layer. In alternative embodiments, at least some of the fins 102 are dummy fins and are replaced with active fins after the formation of the isolation layer. Besides, the fins 102 include a material the same as or different from that of the substrate 100.

Still referring to FIG. 1A, a dummy gate 106 is formed on the substrate 100 and across the fins 102. In some embodiments, the dummy gate 106 extends in a direction different from (e.g., perpendicular to) the extending direction of the fins 102. The dummy layer 106 includes a silicon-containing material such as polysilicon, amorphous silicon or a combination thereof. In some embodiments, an optional mask layer is formed on the dummy gate 106, and the mask layer includes silicon oxide, silicon nitride, a combination thereof or the like. In some embodiments, the method of forming the dummy layer 106 includes depositing a dummy material layer on the substrate 100 covering the fins 102, and patterning the dummy material layer by photolithography and etching processes.

Thereafter, spacers 110 are formed on sidewalls of the dummy gate 106. In some embodiments, the spacers 110 include a nitrogen-containing dielectric material, a carbon-containing dielectric material or both, and the spacers have a dielectric constant less than about 10, less than 9, less than 8, less than about 7, less than about 6 or even less than about 5. In some embodiments, the spacers 110 includes SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the spacers 110 are made of a single material. In alternative embodiments, each of the spacers 110 is a multi-layer structure. In some embodiments, the method of forming the spacers 110 includes forming at least one spacer material layer on the isolation layer 104 covering the dummy gate 106, and removing a portion of the spacer material layer by at least one anisotropic etching process.

Figure 1B:
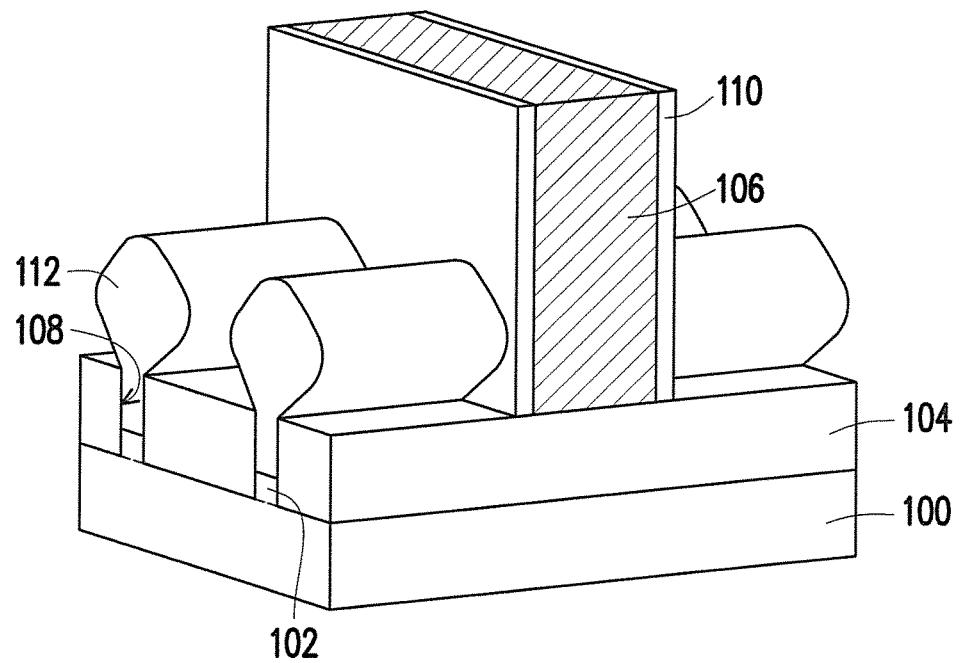

Referring to FIG. 1B, multiple source/drain regions 112 are formed at two opposite sides of the dummy gate 106. Specifically, two source/drain regions 112 are formed at both sides of each fin 102. In some embodiments, the exposed upper portions of the fins 102 are removed by using a suitable technique such as an anisotropic etching process, and therefore, recesses 108 are formed in the isolation layer 104. In some embodiments, the exposed upper portions of the fins 102 are removed by using the dummy gate 106 and the spacers 110 as an etch mask. That is, the step of forming the recesses 108 is considered a self-aligned etching step. In some embodiments, an enlarging step and/or a rounding step can be included after the recess forming step, so the resulting recess profile can have a diamond-like shape, a bucket-like shape or the like.

Thereafter, the source/drain regions 112 are formed by selectively growing epitaxy layers from the recesses 108. Specifically, the source/drain regions 112 are formed within the recesses 108 and extend upwardly along the sidewalls of the corresponding spacers 110. In some embodiments, the source/drain regions 112 include silicon germanium, silicon carbon or silicon phosphate. In some embodiments, the source/drain regions 112 include silicon germanium (SiGe) for a P-type FinFET device. In alternative embodiments, the source/drain regions 112 include silicon carbon (SiC), silicon phosphate (SiP), SiCP or a SiC/SiP multi-layer structure for an N-type FinFET device. In some embodiments, the source/drain regions 112 may be optionally implanted with an N-type dopant or a P-type dopant as needed. In some embodiments, the adjacent source/drain regions 112 at the same side are separate from each other, as shown in FIG. 1B. In alternative embodiments, the adjacent source/drain regions 112 at the same side are connected. Following the formation of the source/drain regions 112, silicide regions may be formed by siliciding the top portions of the source/drain regions 112.

Figure 1C:
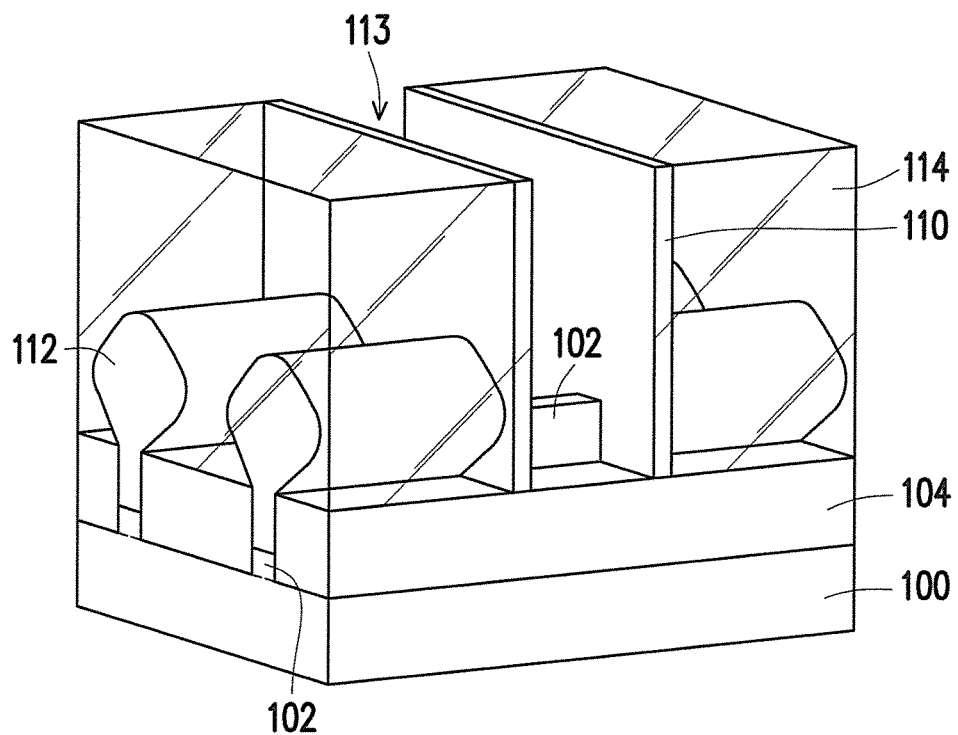

Referring to FIG. 1C, a dielectric layer 114 is formed aside or around the dummy gate 106. The dielectric layer 114 includes a nitride such as silicon nitride, an oxide such as silicon oxide, phosphosilicate glass (PSG), borosilicate glass (BSG), boron-doped phosphosilicate glass (BPSG), a combination thereof or the like. In some embodiments, the dielectric layer 114 is made of a single material. In alternative embodiments, the dielectric layer 114 includes a multi-layer structure. The dielectric layer 114 may be filled until its top surface is higher than the top surface of the dummy gate 106 by a suitable fabrication technique such as spin-coating, CVD, flowable CVD, PECVD, ALD, a combination or the like. A planarization step such as CMP is then performed to remove the excess dielectric layer. In some embodiments, the dummy gate 106 is used as a polish stop layer, so that the top surface of the dielectric layer 114 is substantially level with the top surface of the dummy gate 106. In some embodiments, a contact etch stop layer (CESL) is formed after the step of forming the source/drain regions 112 and before the step of forming the dielectric layer 114, and the CESL includes SiN, SiC or the like.

Thereafter, the dummy gate 106 is removed to form a trench 113 in the dielectric layer 114. The removing step includes performing a suitable etching process. In some embodiments, the stop layers (e.g., silicon oxide layers) on the surfaces of the fins 102 are simultaneously removed during the step of removing the dummy gate 106.

Figure 1D:
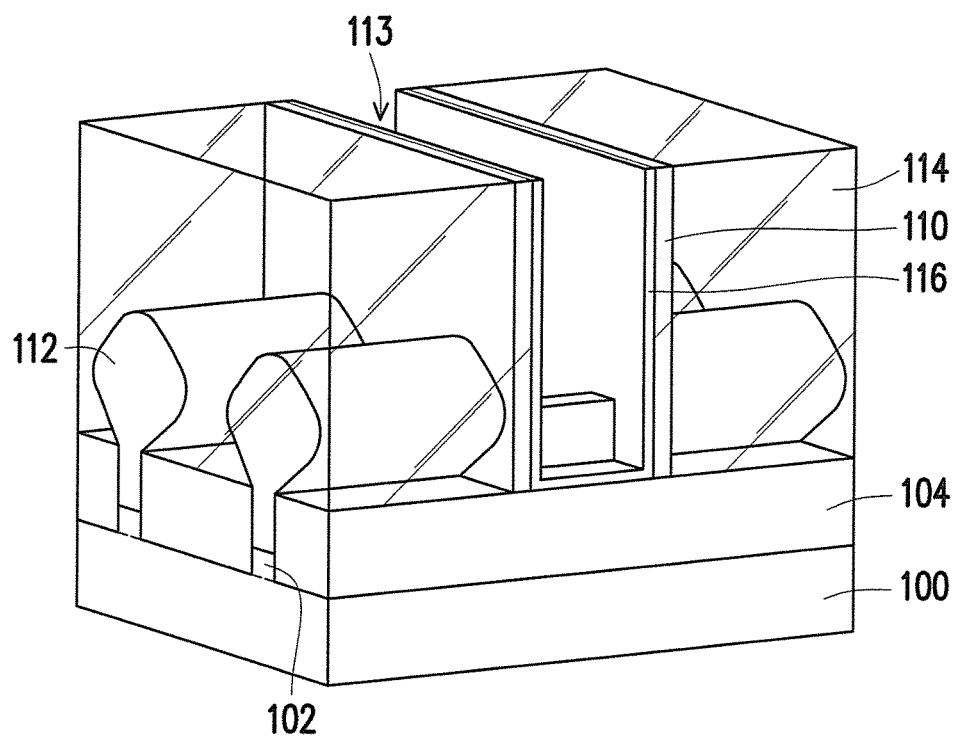

Referring to FIG. 1D, an oxide-inhibiting layer 116 is deposited on the surface of the trench 113. Specifically, the oxide-inhibiting layer 116 is formed on the sidewall and bottom of the trench 113 and on the top and sidewall of each fin 102. In some embodiments, the oxide-inhibiting layer 116 is in physical contact with the fins 102.

Herein, the term "oxide-inhibiting layer" is referred to as an element for inhibiting the growth of an oxide film. Specifically, oxide is not present within the oxide-inhibiting layer or on the surface of the oxide-inhibiting layer. In some embodiments, the oxide-inhibiting layer is an oxide-free layer. In some embodiments, the oxide-inhibiting layer 116 has a dielectric constant greater than about 8. In some embodiments, the oxide-inhibiting layer 116 includes aluminum nitride (AlN), indium nitride (InN), gallium nitride (GaN), thallium nitride (TlN), a combination thereof or the like. The combination thereof can be a multi-layer structure including at least two of the above-mentioned materials or a mixed composition such as AlGaN, AlGaInN or the like. In some embodiments, the method of forming the oxide-inhibiting layer 116 includes performing a suitable deposition technique, such as chemical vapor deposition (CVD), plasma-enhanced CVD (PECVD), atomic layer deposition (ALD), remote plasma ALD (RPALD), plasma-enhanced ALD (PEALD), molecular-beam deposition (MBD) or the like.

It is noted that the oxide-inhibiting layer 116 is formed in a phase-stable amorphous state, so as to prevent leakage currents from passing along grain boundaries and therefore prevent the underlying elements from being damaged. Herein, the oxide-inhibiting layer 116 in an amorphous state is referred to as an amorphous oxide-inhibiting layer through the description of the disclosure. Besides, the high dielectric constant value (greater than 8) of the oxide-inhibiting layer 116 is beneficial to significantly reduce the effective oxide thickness (EOT) of the gate dielectric layer.

It is also noted that the formation of the oxide-inhibiting layer decreases Dit (indicating the interface trap density or interface state density), reduces Jg (indicating leakage current) and lower the capacitance equivalent thickness (CET), so the reliability of the device is therefore improved.

Figure 1E:
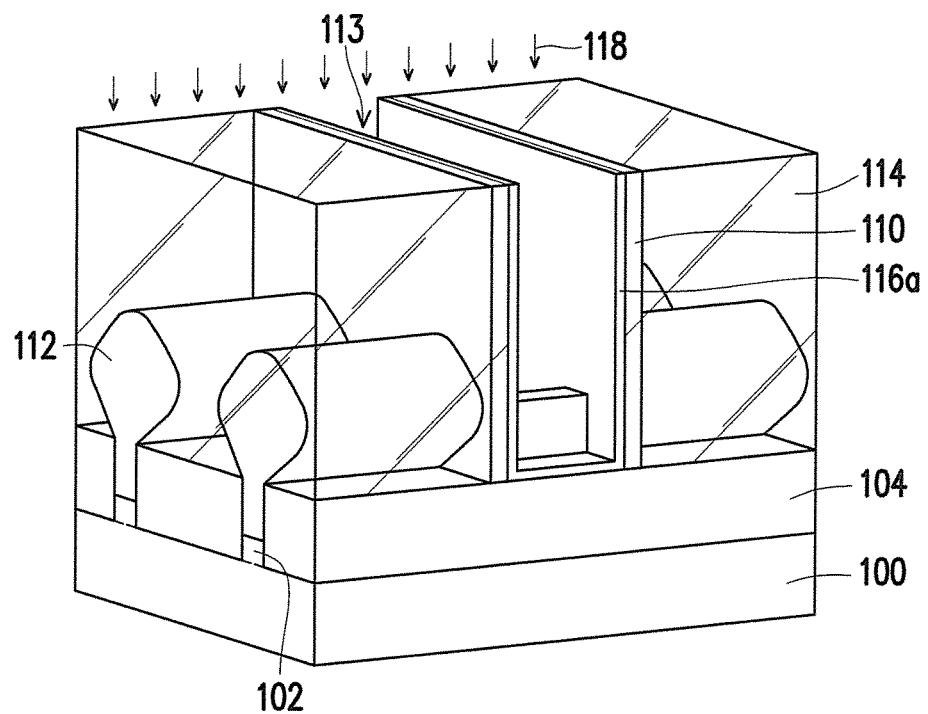

Referring to FIG. 1E, a plasma treatment 118 is performed to the oxide-inhibiting layer 116. In some embodiments, the plasma treatment 118 is for passivating and/or cleaning the surface of the oxide-inhibiting layer 116 and fixing the defect vacancies and/or nitrogen vacancies within the oxide-inhibiting layer 116. In some embodiments, the plasma treatment 118 for the oxide-inhibiting layer 116 contributes to a further improvement of the CET, Dit and Jg. In some embodiments, the plasma treatment 118 includes using a nitrogen-containing gas and a hydrogen-containing gas. In some embodiments, the plasma treatment 118 includes using nitrogen ($N_2$) and hydrogen ($H_2$). In alternative embodiments, the plasma treatment 118 includes using nitrogen ($N_2$) and ammonium ($NH_3$). Herein, the plasma-treated oxide inhibiting layer is indicated as an oxide inhibiting layer 116a. Upon the plasma treatment 118, the oxide inhibiting layer 116a remains in the amorphous state.

Figure 1F:
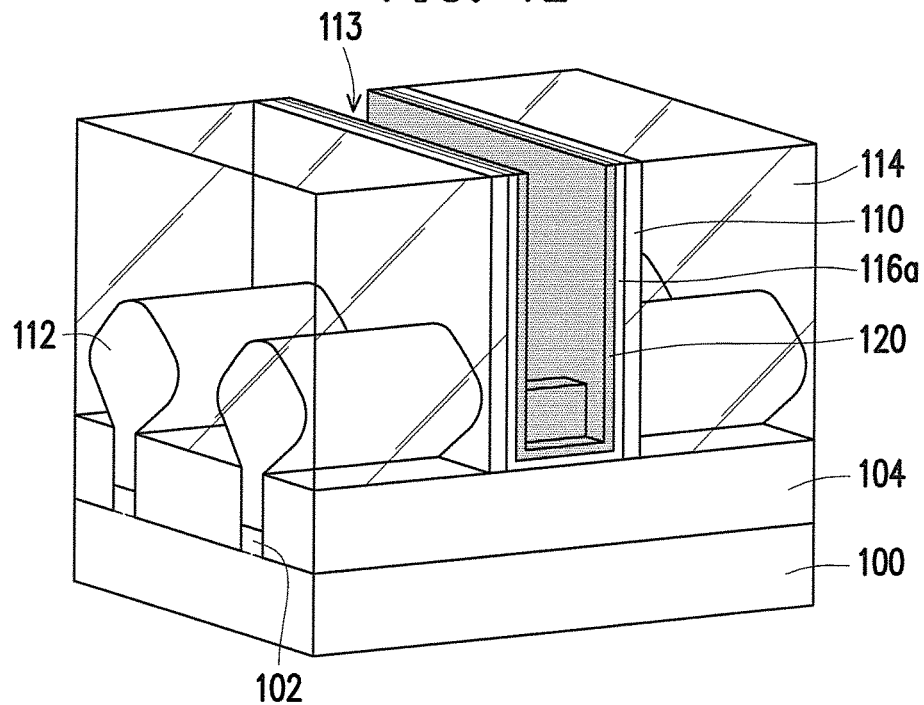

Referring to FIG. 1F, a high-k layer 120 is deposited on the oxide-inhibiting layer 116a. Specifically, the high-k layer 120 is conformally formed on the surface of the oxide-inhibiting layer 116a. In some embodiments, the high-k layer 120 has a dielectric constant greater than about 10. Specifically, the high-k layer 120 has a dielectric constant greater than that of the oxide inhibiting layer 116/116a. In some embodiments, the high-k layer 120 is a single layer. In alternative embodiments, the high-k layer 120 is a multi-layer layer. In some embodiments, the high-k layer 120 includes a lower high-k layer and an upper high-k layer, and the dielectric constant of the lower high-k layer is between the dielectric constant of the oxide inhibiting layer 116a and the dielectric constant of the upper high-k layer. For example, the dielectric constant of the oxide inhibiting layer 116a is greater than about 8, the dielectric constant of the lower high-k layer is greater than about 10, and the dielectric constant of the upper high-k layer is greater than about 12.

In some embodiments, the high-k layer 120 includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the high-k material 120 can optionally include a silicate such as HfSiO, LaSiO, AlSiO, a combination thereof, or a suitable material. In some embodiments, the method of forming the high-k layer 120 includes performing at least one suitable deposition technique, such as CVD, PECVD, metal oxide chemical vapor deposition (MOCVD), ALD, RPALD, PEALD, MBD or the like.

In some embodiments, the high-k layer 120 is formed in a fully amorphous state. In alternative embodiments, the high-k layer 120 is formed in a partially crystalline state; that is, the high-k layer 120 is formed in a mixed crystalline-amorphous state and having some degree of structural order. In yet alternative embodiments, the high-k layer 120 is formed in a fully crystalline state. The dielectric constant of the high-k layer 120 can change depending upon whether the material is amorphous or crystalline. A material in a crystalline state usually has a dielectric constant greater than that of the same material in an amorphous state.

Figure 1G:
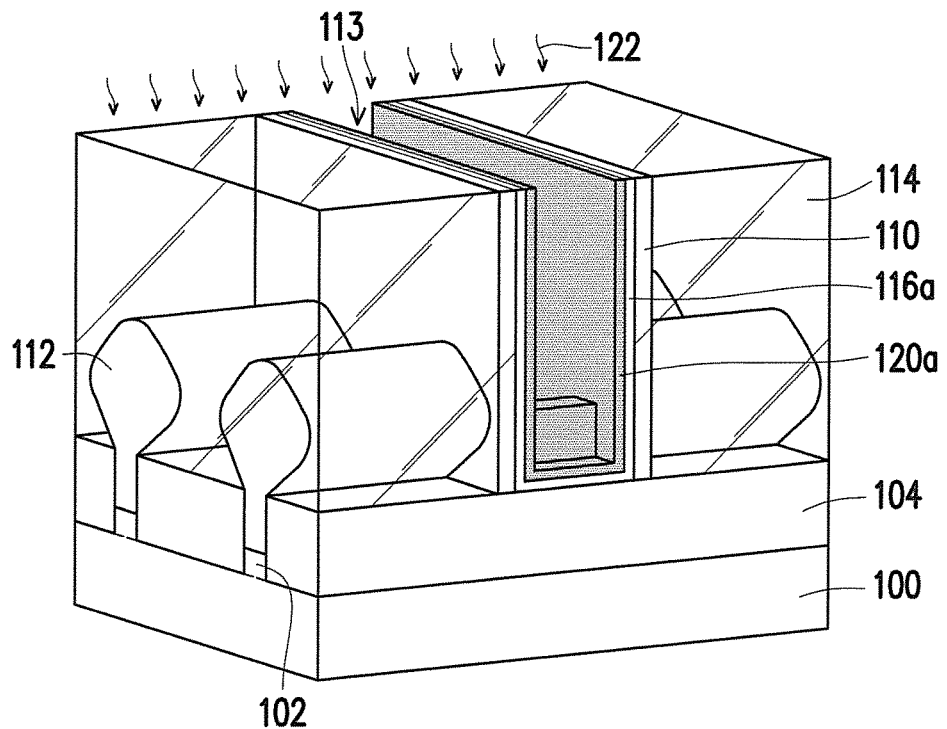

Referring to FIG. 1G, an optional annealing step 122 is performed to the high-k layer 120. In some embodiments, upon the annealing step 122, the high-k layer 120 is transformed from an amorphous state to a partially or fully crystalline sate. In alternative embodiments, upon the annealing step 122, the high-k layer 120 is transformed from a partially crystalline state to a fully crystalline sate.

In some embodiments, the annealing temperature of the annealing step 122 ranges from about 300° C. to 1,500° C., such as from about 400° C. to 1,000° C. The annealing temperature is varied depending on the transformation or crystallization temperature of the high-k layer 120, and the temperature ranges are not limited by the above-mentioned values. Herein, the annealed high-k layer is indicated as a high-k layer 120a.

It is noted that the oxide-inhibiting layer 116a is in a phase-stable amorphous state, so the plasma treatment 118 and the annealing step 122 do not change the state/phase of the oxide-inhibiting layer 116a. Thereafter, upon the annealing step 122, the oxide-inhibiting layer 116a remains in an amorphous state, and the high-k layer 120a above the oxide-inhibiting layer 116a is transformed into a crystalline state. However, the annealing step 122 can be omitted as needed. In such case, the oxide-inhibiting layer 116a remains in an amorphous state, and the high-k layer 120 above the oxide-inhibiting layer 116a remains in its original state such as an amorphous state or a crystalline state. For either case, the amorphous oxide-inhibiting layer 116a serves as a blocking layer to block leakage currents from passing through.

Referring to FIG. 1G, a gate 124 (or called "replacement gate") is formed in the trench 113. Specifically, the gate 124 filling the remaining trench 113. In some embodiments, the gate 124 includes metal, such as TiN, TaC, TaN, TaSiN, HfN, $ZrSi_2$, $MoSi_2$, $TaSi_2$, $NiSi_2$, WN or the like. When the device of the disclosure is an N-type FinFET device, the gate 124 includes an N-type work function metal material. When the device of the disclosure is a P-type FinFET device, the gate 124 includes a P-type work function metal material. The gate 124 is formed by a suitable deposition technique such as CVD, ALD, PVD, sputtering, plating, a combination thereof or the like. A FinFET device 10 of the disclosure is thus completed.

In some embodiments, the oxide-inhibiting layer is introduced between the substrate and the high-k layer, so as to suppress the formation of the low-k silicate interfacial layer, leading to the reduction in CET. Besides, the oxide-inhibiting layer is formed in a phase-stable amorphous state, so as to prevent leakage currents from passing along grain boundaries and therefore prevent the underlying elements from being damaged. Therefore, the CET, Dit and Jg are improved, and the performance of the device is enhanced.

The above-mentioned embodiments in which the oxide-inhibiting layer 116a is in physical contact with the fins 102 is provided for illustration purposes, and are not construed as limiting the present disclosure. In some embodiments, the oxide-inhibiting layer 116 is not in physical contact with the fins 102.

Figure 1H:
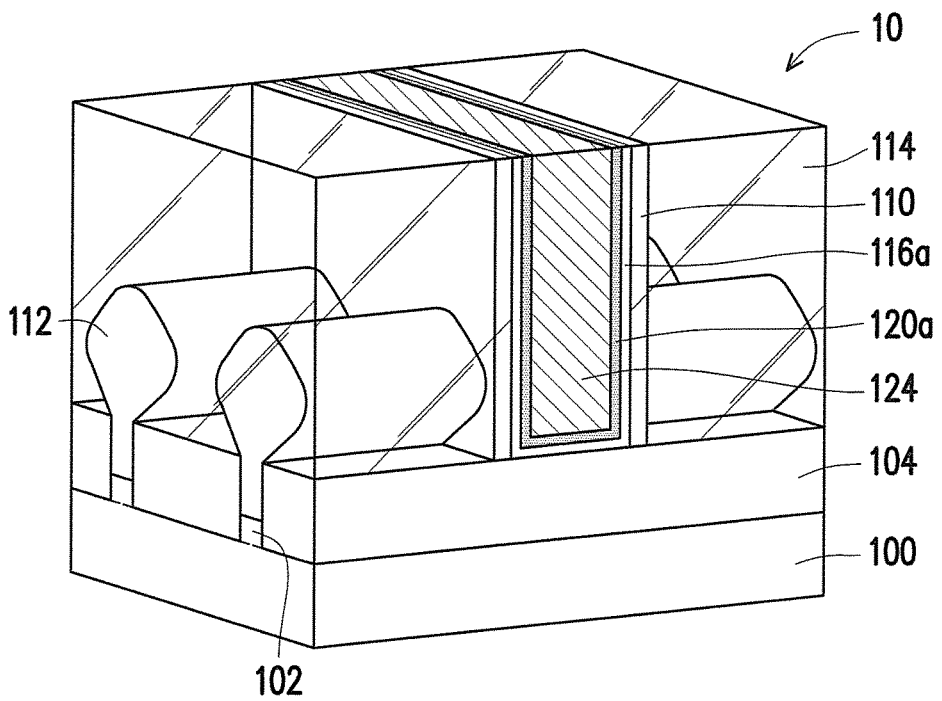
Figure 2A:
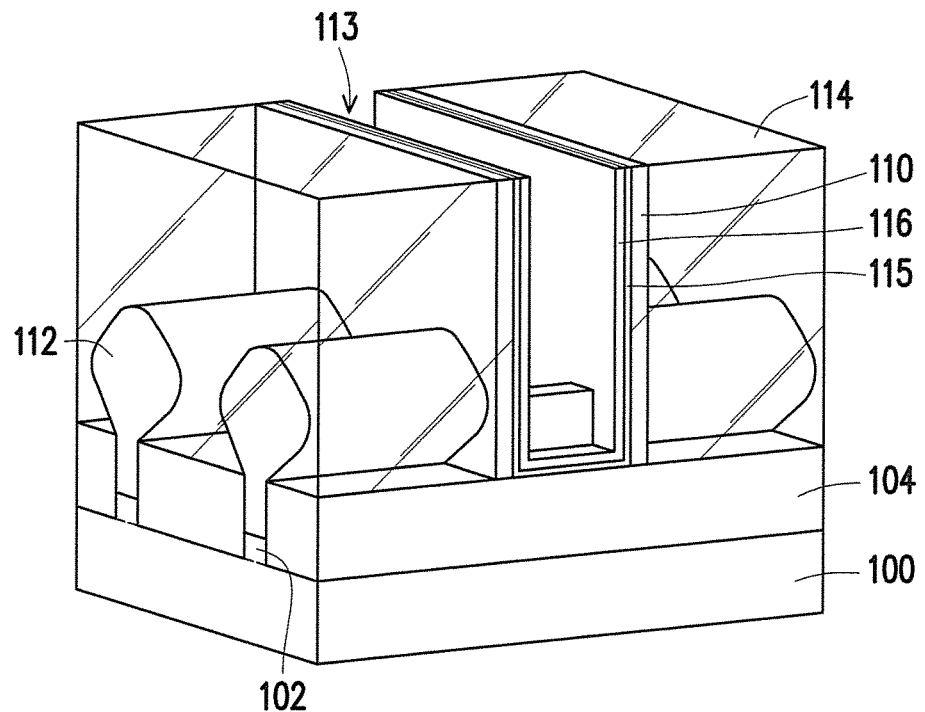
FIG. 2A to FIG. 2B are schematic perspective views of a method of forming a FinFET device in accordance with alternative embodiments.
Figure 2B:
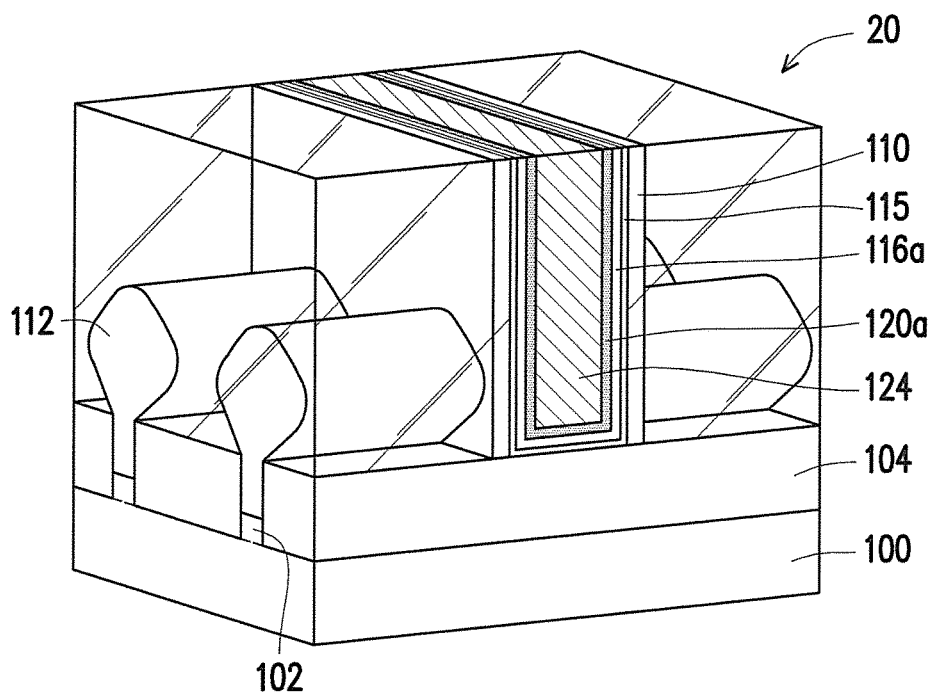

FIG. 2A to FIG. 2B are schematic perspective views of a method of forming a FinFET device in accordance with alternative embodiments. The method of FIG. 1A to FIG. 1H is similar to the method of FIG. 2A to FIG. 2B, and the difference between them lies in that in the latter method, an oxide-based layer is further provided between the oxide-inhibiting layer 116a and each of the fins 102.

Referring to FIG. 2A, an intermediate structure of FIG. 1C is provided, and an oxide-based layer 115 is formed at least on the surfaces of the fins 102. In some embodiments, the oxide-based layer 115 is in physical contact with the fins 102.

Herein, the term "oxide-based layer" is referred to as an oxygen-containing element. In some embodiments, the oxide-based layer 115 has a dielectric constant less than about 8, less than about 6 or even less than about 4. In some embodiments, the oxide-based layer 115 includes silicon oxide, silicon oxynitride, a combination thereof or the like.

In some embodiments, the oxide-based layer 115 is formed on the sidewall and bottom of the trench 113 and on the top and sidewall of each fin 102. In some embodiments, the method of forming the oxide-based layer 115 includes performing a suitable depositing technique, such as CVD, PECVD, ALD, RPALD, PEALD, MBD or the like.

In alternative embodiments, the oxide-based layer 115 is formed merely on the top and sidewall of each fin 102, and such oxide-based layer 115 can be formed through thermal oxidation.

In yet alternative embodiments, the oxide-based layer 115 can be the stop layers formed on the surfaces of the fins 102 after the fins 102 are provided, and the stop layers are substantially intact during the step of removing the dummy gate 106.

In some embodiments, the oxide-based layer 115 is in an amorphous state. In alternative embodiments, the oxide-based layer 115 is in a crystalline state. In yet alternative embodiments, the oxide-based layer 115 is in a mixed crystalline-amorphous state. The state/phase of the oxide-based layer 115 does not matter as long as the oxide-inhibiting layer is provided in an amorphous state for blocking leakage currents from passing through.

Still referring to FIG. 2A, an oxide-inhibiting layer 116 is deposited on the oxide-based layer 115. Specifically, the oxide-inhibiting layer 116 is conformally formed on the surface of the oxide-based layer 115. Steps similar to those described in FIG. 1D to 1H are then performed. A FinFET device 20 of the disclosure is thus completed, as shown in FIG. 2B. Similarly, the oxide-inhibiting layer is introduced between the substrate and the high-k layer, so as to improve the CET, Dit and Jg and therefore enhance the performance of the device.

Figure 3:
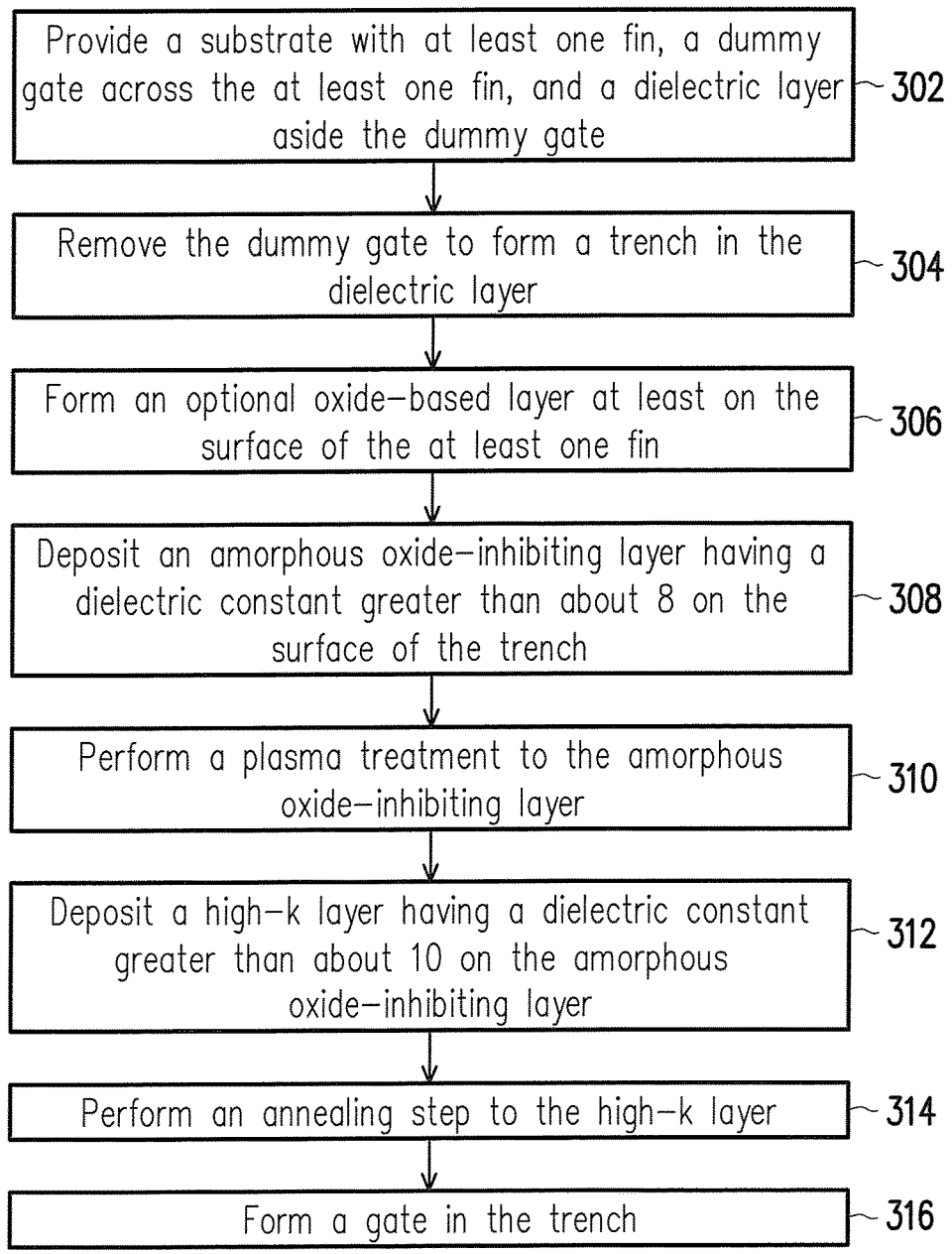
FIG. 3 is a flow chart of a method of forming a FinFET device in accordance with some embodiments.

The above-mentioned process steps can be concisely illustrated with reference to the flow chart of FIG. 3.

At step 302, a substrate 100 is provided with at least one fin 102, a dummy gate 106 across the at least one fin 102, and a dielectric layer 114 aside the dummy gate 106, as shown in FIG. 1A to FIG. 1B. At step 304, the dummy gate 106 is removed to form a trench 113 in the dielectric layer 114, as shown in FIG. 1C and FIG. 2A. At step 306, an optional oxide-based layer 115 is formed at least on the surface of the at least one fin 102, as shown in FIG. 2A. At step 308, an amorphous oxide-inhibiting layer 116 having a dielectric constant greater than about 8 is deposited on the surface of the trench 113, as shown in FIG. 1D and FIG. 2A. In some embodiments, the amorphous oxide-inhibiting layer 116 is formed in contact with the at least one fin 102, as shown in FIG. 1D. In alternative embodiments, the amorphous oxide-inhibiting layer 116 is formed in contact with the oxide-based layer 115 without contacting the at least one fin 102, as shown in FIG. 2A. At step 310, a plasma treatment 118 is performed to the amorphous oxide-inhibiting layer 116, so as to form an amorphous oxide-inhibiting layer 116a, as shown in FIG. 1E. At step 312, a high-k layer 120 having a dielectric constant greater than about 10 is deposited on the amorphous oxide-inhibiting layer 116a, as shown in FIG. 1F. At step 314, an annealing step 122 is performed to the high-k layer 120, so as to form a high-k layer 120a, as shown in FIG. 1G. In some embodiments, the state/phase of the high-k layer 120a is transformed into a crystalline state upon the annealing step 122. At step 316, a gate 124 is formed in the trench 113, as shown in FIG. 1H and FIG. 2B.

The structures of the FinFET devices of the disclosure are described with reference to FIG. 1H and FIG. 2B.

In some embodiments, a FinFET device 10/20 includes a substrate 100 having at least one fin 102, a gate 124 including a metal-containing material disposed across the at least one fin 102, a gate dielectric layer between the gate 124 and the at least one fin 102, spacers 110 on the sidewalls of the gate 124 and source/drain regions 112 at two ends of the at least one fin 102.

In some embodiments, the gate dielectric layer includes an oxide-inhibiting layer 116a and a high-k layer 120a, as shown in FIG. 1H. In such case, the oxide-inhibiting layer 116a is in contact with the at least one fin 102. In some embodiments, the oxide-inhibiting layer 116a has a dielectric constant lower than that of the high-k layer 120a. For example, the oxide-inhibiting layer 116a has a dielectric constant greater than about 8, and the high-k layer 120a has a dielectric constant greater than about 10. In some embodiments, the amorphous oxide-inhibiting layer and the crystalline high-k layer have a combined EOT less than about 0.4 nm or less than about 0.3 nm.

In alternative embodiments, the gate dielectric layer includes an oxide-based layer 115, an oxide-inhibiting layer 116a and a high-k layer 120a, as shown in FIG. 2B. In such case, the oxide-inhibiting layer 116a is not in contact with the at least one fin 102. In some embodiments, the oxide-inhibiting layer 116a has a dielectric constant lower than that of the high-k layer 120a while greater than that of the oxide-based layer 115. For example, the oxide-based layer 115 has a dielectric constant less than about 8, the inhibiting layer 116a has a dielectric constant greater than about 8, and the high-k layer 120a has a dielectric constant greater than about 10.

In some embodiments, the oxide-based layer 115 includes silicon oxide, silicon oxynitride or a combination thereof. In some embodiments, the oxide-inhibiting layer 116a includes metal nitride in an amorphous state, such as aluminum nitride, indium nitride, gallium nitride, thallium nitride, a combination thereof or the like. In some embodiments, the high-k layer 120a includes metal oxide in a crystalline state.

The above-mentioned embodiments in which the method of the disclosure is applied to a FinFET device process is provided for illustration purposes, and are not construed as limiting the present disclosure. In alternative embodiments, the method of disclosure can be applied to a planar device process.

Figure 4:
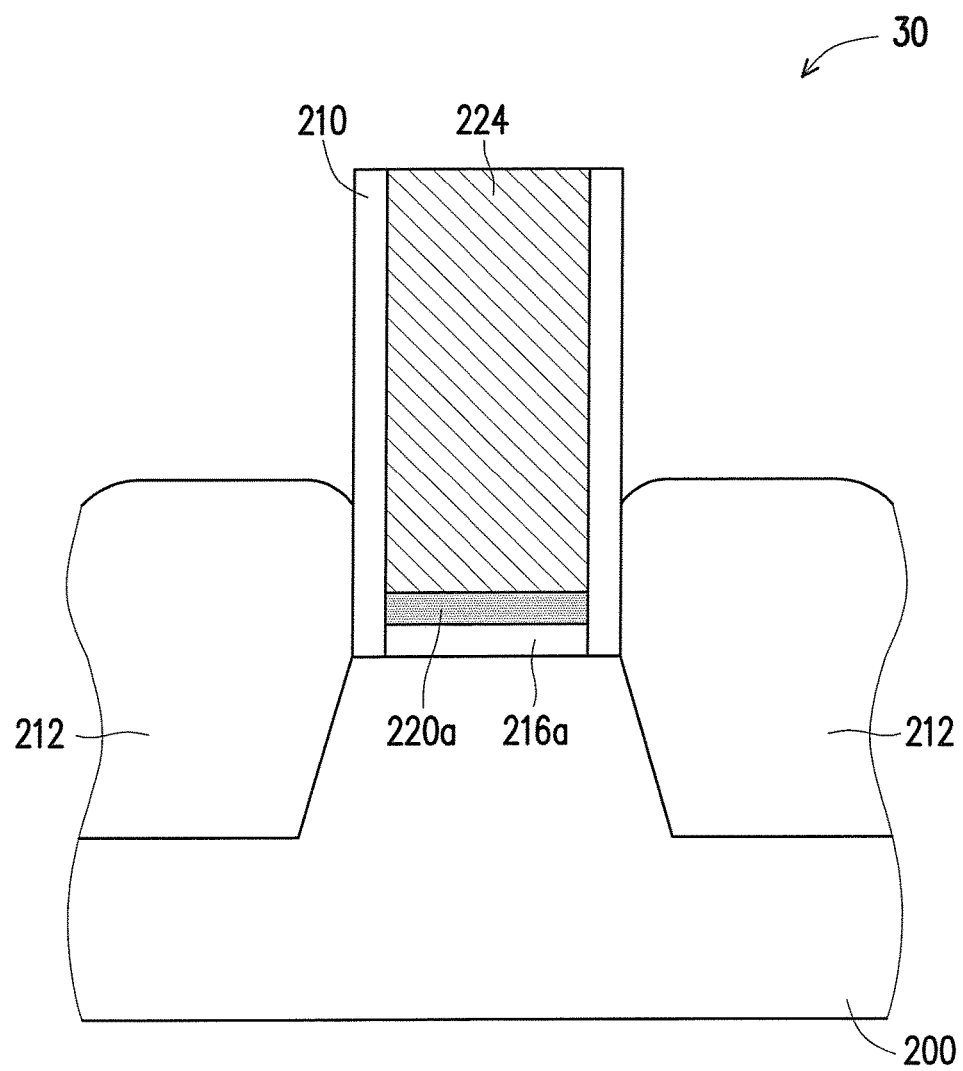
FIG. 4 is a cross-sectional view of a semiconductor device in accordance with some embodiments.
Figure 5:
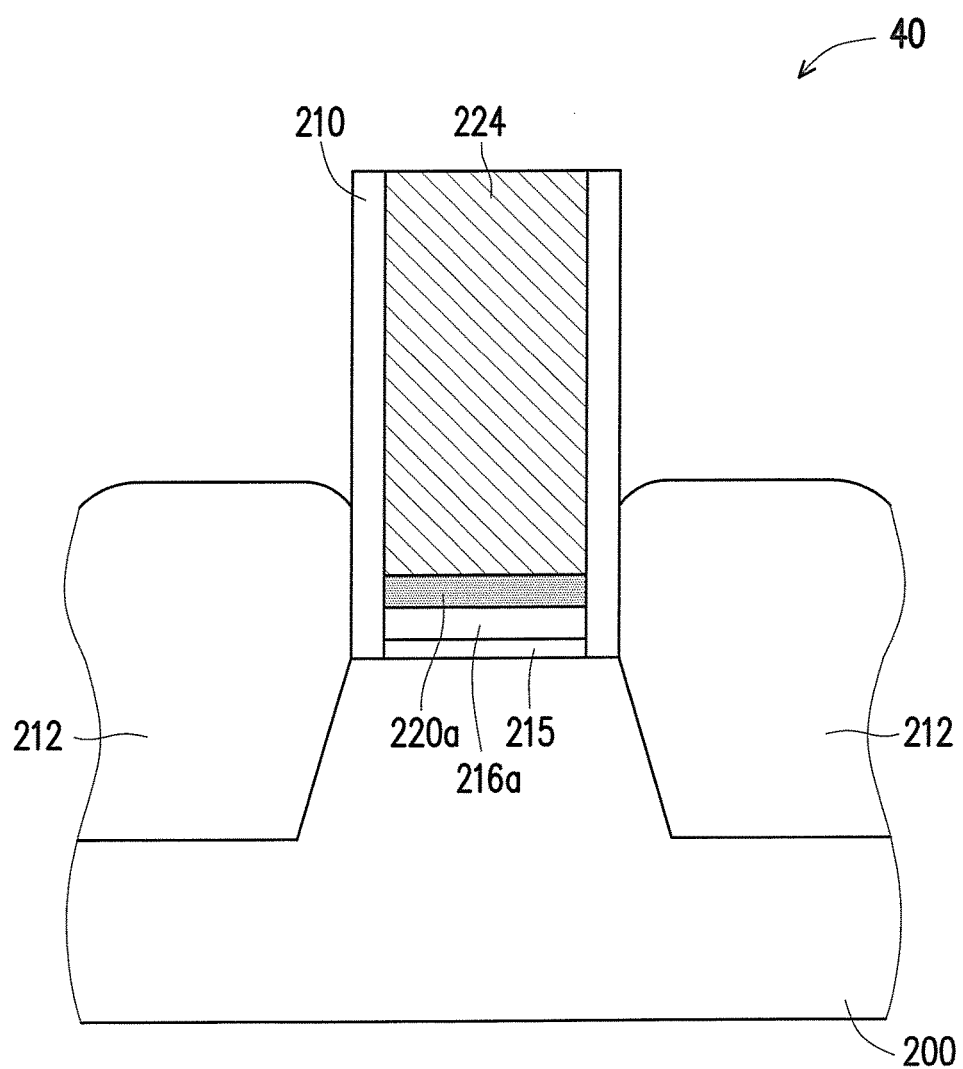
FIG. 5 is a cross-sectional view of a semiconductor device in accordance with alternative embodiments.

FIG. 4 is a cross-sectional view of a semiconductor device in accordance with some embodiments. FIG. 5 is a cross-sectional view of a semiconductor device in accordance with alternative embodiments.

As shown in FIG. 4 and FIG. 5, a semiconductor device 30/40 includes a substrate 200 and a gate 224 over the substrate 200, a gate dielectric layer between the gate 224 and the substrate 200, spacers 210 on the sidewalls of the gate 224 and source/drain regions 212 in the substrate 200 beside the gate 224. In some embodiments, the substrate 200 is a planar substrate. The gate 224 includes a silicon-containing material, a metal-containing material or a combination thereof.

In some embodiments, the gate dielectric layer includes an oxide-inhibiting layer 216a and a high-k layer 220a, as shown in FIG. 4. In such case, the oxide-inhibiting layer 216a is in contact with the substrate 200. In some embodiments, the oxide-inhibiting layer 216a has a dielectric constant lower than that of the high-k layer 220a. For example, the oxide-inhibiting layer 216a has a dielectric constant greater than about 8, and the high-k layer 220a has a dielectric constant greater than about 10.

In alternative embodiments, the gate dielectric layer includes an oxide-based layer 215, an oxide-inhibiting layer 216a and a high-k layer 220a, as shown in FIG. 5. In such case, the oxide-inhibiting layer 216a is not in contact with the substrate 200. In some embodiments, the oxide-inhibiting layer 216a has a dielectric constant lower than that of the high-k layer 220a while greater than that of the oxide-based layer 215. For example, the oxide-based layer 215 has a dielectric constant less than about 8, the inhibiting layer 216a has a dielectric constant greater than about 8, and the high-k layer 220a has a dielectric constant greater than about 10.

In view of the above, in some embodiments, an amorphous oxide-inhibiting layer is introduced between a crystalline high-k layer and a substrate to suppress the formation of the low-k silicate interfacial layer, leading to a reduction in CET. Besides, the Jg is also suppressed by the amorphous oxide-inhibiting layer by three orders of magnitude. In addition, the decrease of Dit can be accomplished because of the hydrogen passivation from the plasma treatment to amorphous oxide-inhibiting layer. Moreover, the plasma treatment further reduces the CET, Dit, and Jg due to deactivation of the nitrogen vacancies. By the disposition of the disclosure, the performance and reliability of the device are accordingly improved.

In accordance with some embodiments of the present disclosure, a semiconductor device includes a substrate, a gate over the substrate and a gate dielectric layer between the gate and the substrate. The gate dielectric layer includes an oxide-inhibiting layer having a dielectric constant greater than about 8 and being in an amorphous state.

In accordance with alternative embodiments of the present disclosure, a FinFET device includes a substrate having at least one fin, a gate disposed across the at least one fin and a gate dielectric layer between the gate and the at least one fin. The gate dielectric layer includes an oxide-inhibiting layer having a dielectric constant greater than about 8 and being in an amorphous state, and a high-k layer having a dielectric constant greater than about 10 and being in a crystalline state.

In accordance with yet alternative embodiments of the present disclosure a method of forming a FinFET device including the following steps. A substrate is provided with at least one fin, a dummy gate across the at least one fin, and a dielectric layer aside the dummy gate. The dummy gate is removed to form a trench in the dielectric layer. An amorphous oxide-inhibiting layer having a dielectric constant greater than about 8 is deposited on a surface of the trench. A plasma treatment is performed to the amorphous oxide-inhibiting layer. A gate is formed in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    a gate over the substrate; and
    a gate dielectric layer between the gate and the substrate and comprising:
        an oxide-free layer having a dielectric constant greater than about 8 and being in an amorphous state; and
        a high-k layer between the oxide-free layer and the gate, and a dielectric constant of the high-k layer is greater than the dielectric constant of the oxide-free layer.

2. The semiconductor device of claim 1, wherein the substrate has at least one fin extending in a first direction, and the gate extends in a second direction different from the first direction and is across the at least one fin.

3. The semiconductor device of claim 1, wherein the substrate is a planar substrate.

4. The semiconductor device of claim 1, wherein the oxide-free layer comprises aluminum nitride, indium nitride, gallium nitride, thallium nitride or a combination thereof.

5. The semiconductor device of claim 1, wherein the high-k layer is in a crystalline state.

6. The semiconductor device of claim 1, wherein the gate dielectric layer further comprises an oxide-based layer between the oxide-free layer and the substrate.

7. The semiconductor device of claim 1, wherein the gate comprises a silicon-containing material, a metal-containing material or a combination thereof.

8. A FinFET device, comprising:
    a substrate having at least one fin;
    a gate disposed across the at least one fin; and
    a gate dielectric layer between the gate and the at least one fin and comprising:
        an oxide-inhibiting layer having a dielectric constant greater than about 8 and being in an amorphous state; and
        a high-k layer having a dielectric constant greater than about 10 and being in a crystalline state.

9. The FinFET device of claim 8, wherein the oxide-inhibiting layer is in physical contact with the at least one fin.

10. The FinFET device of claim 8, wherein the oxide-inhibiting layer is not in physical contact with the at least one fin.

11. The FinFET device of claim 8, wherein the oxide-inhibiting layer comprises aluminum nitride, indium nitride, gallium nitride, thallium nitride or a combination thereof.

12. The FinFET device of claim 8, wherein the oxide-inhibiting layer is an oxide-free layer.

13. The FinFET device of claim 8, wherein the high-k layer comprises a lower high-k layer and an upper high-k layer, and a dielectric constant of the lower high-k layer is between the dielectric constant of the oxide-inhibiting layer and a dielectric constant of the upper high-k layer.

14. A method of forming a FinFET device, comprising:
    providing a substrate with at least one fin, a dummy gate across the at least one fin, and a dielectric layer aside the dummy gate;
    removing the dummy gate to form a trench in the dielectric layer;
    depositing an amorphous oxide-inhibiting layer having a dielectric constant greater than about 8 on a surface of the trench;
    performing a plasma treatment to the amorphous oxide-inhibiting layer; and
    forming a gate in the trench,
    wherein the method further comprises depositing a high-k layer having a dielectric constant greater than about 10 on the amorphous oxide-inhibiting layer after the step of performing the plasma treatment.

15. The method of claim 14, wherein the amorphous oxide-inhibiting layer comprises aluminum nitride, indium nitride, gallium nitride, thallium nitride or a combination thereof.

16. The method of claim 14, wherein the plasma treatment comprises using a nitrogen-containing gas and a hydrogen-containing gas.

17. The method of claim 14, further comprising, after the step of depositing the high-k layer, performing an annealing step to the high-k layer, so that the high-k layer is transformed into a crystalline sate.

18. The method of claim 14, further comprising, before the step of forming the amorphous oxide-inhibiting layer, forming an oxide-based layer at least on a surface of the at least one fin.

\* \* \* \* \*